(12) United States Patent
Fujikawa et al.

(10) Patent No.: US 8,371,663 B2
(45) Date of Patent: Feb. 12, 2013

(54) CABINET FOR ELECTRONIC DEVICE

(75) Inventors: Akihiro Fujikawa, Osaka (JP); Shinichiro Sakamoto, Osaka (JP); Yuki Ogaki, Osaka (JP); Hideo Yonezawa, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 211 days.

(21) Appl. No.: 12/557,561

(22) Filed: Sep. 11, 2009

(65) Prior Publication Data

US 2010/0066217 A1   Mar. 18, 2010

(30) Foreign Application Priority Data

Sep. 12, 2008 (JP) .................................. 2008-234550

(51) Int. Cl.
- A47B 81/06 (2006.01)
- A47B 97/00 (2006.01)
- H04N 5/64 (2006.01)
- H01J 5/24 (2006.01)

(52) U.S. Cl. ..... 312/7.2; 312/223.2; 348/836; 220/2.1 A (58) Field of Classification Search ............... 312/7.2, 312/265.5, 265.6, 223.2; 384/836, 839, 843; 361/679.01; 174/562, 561; 403/329; 24/289, 24/292, 297; 348/836, 839, 843; 220/3.8, 220/3.7, 3.2, 4.02, 324, 315, 2.1 A
See application file for complete search history.

(56) References Cited

U.S. PATENT DOCUMENTS

| | | | | |
|---|---|---|---|---|
| 2,818,559 A | * | 12/1957 | Manetti et al. | 348/843 |
| 4,323,807 A | * | 4/1982 | Sugiura | 312/223.2 |
| 5,383,098 A | * | 1/1995 | Ma et al. | 361/818 |
| 5,575,545 A | * | 11/1996 | Wang | 312/7.2 |
| 5,657,893 A | * | 8/1997 | Hitchings | 220/326 |
| 5,710,999 A | * | 1/1998 | Iwase et al. | 455/349 |
| 5,823,641 A | * | 10/1998 | Goto et al. | 312/7.2 |
| 5,931,514 A | * | 8/1999 | Chung | 292/89 |
| 6,111,760 A | * | 8/2000 | Nixon | 361/814 |
| 6,955,514 B2 | * | 10/2005 | Hoshi | 411/508 |
| 6,958,786 B2 | * | 10/2005 | Kim et al. | 348/836 |
| 7,193,859 B2 | * | 3/2007 | Horiuchi | 361/756 |
| 7,365,807 B2 | * | 4/2008 | Iwai | 348/794 |

(Continued)

FOREIGN PATENT DOCUMENTS

| | | |
|---|---|---|
| DE | 33 46 243 A1 | 7/1985 |
| DE | 102 28 980 A1 | 1/2004 |

(Continued)

OTHER PUBLICATIONS

Extended European Search Report of corresponding EP Application No. 09 17 0187.0 dated Aug. 4, 2010.

*Primary Examiner* — David Dunn
*Assistant Examiner* — Ryan A Doyle
(74) *Attorney, Agent, or Firm* — Global IP Counselors (57) ABSTRACT

A cabinet for an electronic device includes a first cabinet member and a second cabinet member. The first cabinet member has a first wall section with an engagement hole. The second cabinet member is fixedly coupled to the first cabinet member. The second cabinet member has a second wall section, an engagement protrusion and a recess. The engagement protrusion is formed on the second wall section and is engaged with the engagement hole of the first wall section. The recess is formed on the second wall section along a base portion of the engagement protrusion. The recess has a rounded portion extending between the base portion of the engagement protrusion and a bottom portion of the recess.

9 Claims, 5 Drawing Sheets

U.S. PATENT DOCUMENTS

| | | | |
|---|---|---|---|
| 7,385,137 B2 * | 6/2008 | Burke et al. | 174/50 |
| 7,669,816 B2 * | 3/2010 | Crain et al. | 248/183.3 |
| 7,697,268 B2 * | 4/2010 | Johnson et al. | 361/643 |
| 2001/0007404 A1 * | 7/2001 | Sugamura | 312/257.1 |
| 2005/0146250 A1 * | 7/2005 | Chung et al. | 312/7.2 |
| 2007/0058355 A1 * | 3/2007 | Lee et al. | 361/801 |
| 2007/0085453 A1 * | 4/2007 | Zhang et al. | 312/7.2 |
| 2008/0180002 A1 * | 7/2008 | Kameoka | 312/7.2 |
| 2008/0180887 A1 * | 7/2008 | Hauser | 361/679 |
| 2009/0316341 A1 * | 12/2009 | Huang | 361/679.01 |

FOREIGN PATENT DOCUMENTS

| | | | |
|---|---|---|---|
| JP | 58121880 A | * | 7/1983 |
| JP | 05-067055 A | | 3/1993 |
| JP | 10-123971 A | | 5/1998 |
| JP | 11-160681 A | | 6/1999 |
| JP | 2004-117875 A | | 4/2004 |

* cited by examiner

CABINET FOR ELECTRONIC DEVICE

CROSS-REFERENCE TO RELATED APPLICATIONS

This application claims priority to Japanese Patent Application No. 2008-234550, filed on Sep. 12, 2008. The entire disclosure of Japanese Patent Application No. 2008-234550 is hereby incorporated herein by reference.

BACKGROUND OF THE INVENTION

1. Field of the Invention

The present invention generally relates to a cabinet. More specifically, the present invention relates to a cabinet for an electronic device.

2. Background Information

A conventional cabinet of an electronic device, such as a liquid crystal television set, includes a synthetic resin front cabinet and a synthetic resin rear cabinet that are coupled together. With the conventional cabinet, screws and engagement protrusions (hooks) are used as coupling means.

With the conventional cabinet, it is desirable to lower costs and make assembly work easier by reducing the number of screws needed. However, if the number of screws is reduced, protruding length of the engagement protrusions and the number of corresponding engagement holes have to be increased to maintain proper joint strength between the front cabinet and the rear cabinet.

When the number of screws is reduced and the protruding length of the engagement protrusions (hooks) is increased in the conventional cabinet, a problem is that the engagement protrusion is prone to breaking when the front cabinet and rear cabinet are taken apart.

With another conventional liquid crystal display device, a prong on a rear panel is engaged with a stepped component on a side face of a frame that supports a liquid crystal panel, and engagement means of a metal frame is engaged with a hook on the side face of the rear panel, thereby integrally connecting the frame, the rear panel, and the metal frame (see Japanese Laid-Open Patent Application Publication No. H11-160681, for example). With further another conventional flat screen image display device, an inner chassis supporting a front glass filter is fastened to a rear case with screws, and a front cover is fixed to the inner chassis and the rear case with hooks (see Japanese Laid-Open Patent Application Publication No. 2004-117875, for example). With further another conventional liquid crystal display panel, fastening prongs of a panel are latched to fastening recesses in a lamp housing (see Japanese Laid-Open Patent Application Publication No. H10-123971, for example). With further another conventional battery case, a springy case hook is provided, and the case hook and a cover hook are rounded at the distal ends, so that the hook is not damaged in the event that a battery cover is closed in the wrong position (see Japanese Laid-Open Utility Model Application Publication No. H5-67055, for example).

However, none of the above-mentioned techniques prevents breakage of the engagement protrusion (hook) of the conventional cabinet, and therefore do not help to solve the above-mentioned problems.

In view of the above, it will be apparent to those skilled in the art from this disclosure that there exists a need for an improved cabinet for an electronic device. This invention addresses this need in the art as well as other needs, which will become apparent to those skilled in the art from this disclosure.

SUMMARY OF THE INVENTION

The present invention was conceived in light of the above-mentioned problems. One object of the present invention is to provide a cabinet for an electronic device with which a breakage of an engagement protrusion is prevented when a front cabinet and a rear cabinet are taken apart.

In accordance with one aspect of the present invention, a cabinet for an electronic device includes a first cabinet member and a second cabinet member. The first cabinet member has a first wall section with an engagement hole. The second cabinet member is fixedly coupled to the first cabinet member. The second cabinet member has a second wall section, an engagement protrusion and a recess. The engagement protrusion is formed on the second wall section and is engaged with the engagement hole of the first wall section. The recess is formed on the second wall section along a base portion of the engagement protrusion. The recess has a rounded portion extending between the base portion of the engagement protrusion and a bottom portion of the recess.

With the cabinet of the present invention, it is possible to provide a cabinet for an electronic device with which a breakage of an engagement protrusion is prevented when a front cabinet and a rear cabinet are taken apart.

These and other objects, features, aspects and advantages of the present invention will become apparent to those skilled in the art from the following detailed descriptions, which, taken in conjunction with the annexed drawings, disclose a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENT

A preferred embodiment of the present invention will now be explained with reference to the drawings. It will be apparent to those skilled in the art from these disclosures that the following descriptions of the preferred embodiment of the present invention are provided for illustration only and not for the purpose of limiting the invention as defined by the appended claims and their equivalents.

Figure 1:
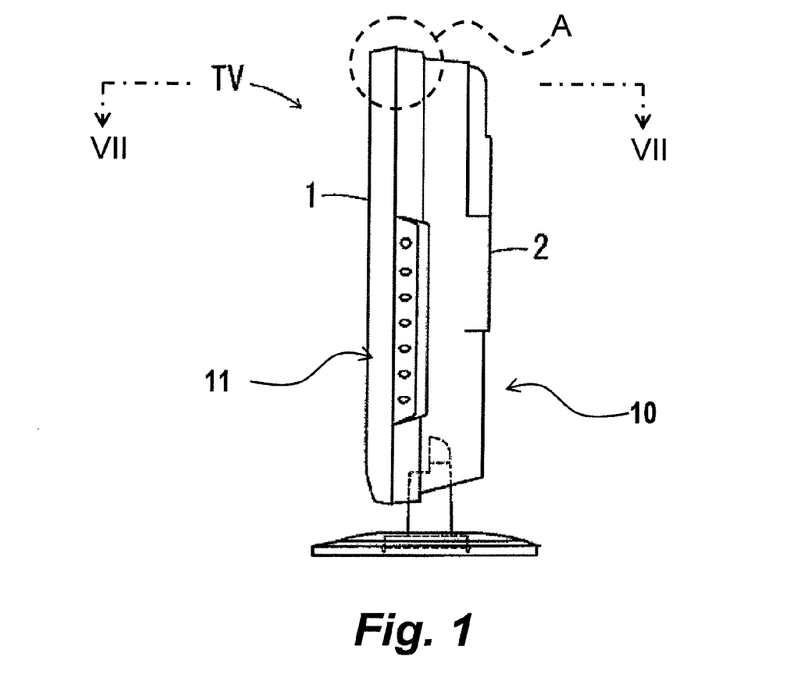
FIG. 1 is a side elevational view of a cabinet of a liquid crystal television in accordance with one embodiment of the present invention.

FIG. 1 is a side elevational view of a liquid crystal television TV. The liquid crystal television TV has a liquid crystal module (not shown), a cabinet 10 and a control key unit 11. The liquid crystal module includes a liquid crystal panel (not shown) to display image. The cabinet 10 has a front cabinet (e.g., second cabinet member) 1 and a rear cabinet (e.g., first cabinet member) 2, and houses the liquid crystal module within an inside space (inner side) of the cabinet 10 defined by the front cabinet 1 and the rear cabinet 2. The front cabinet 1 is rectangular when viewed from a front side of the liquid crystal television TV, and is made of synthetic resin. The front cabinet 1 is integrally formed as a one-piece, unitary member. The rear cabinet 2 is coupled to a rear side of the front cabinet 1, and is made of synthetic resin. The rear cabinet 2 is integrally formed as a one-piece, unitary member. The front cabinet 1 and the rear cabinet 2 are joined together, and are screwed together at their four corners.

Figure 2:
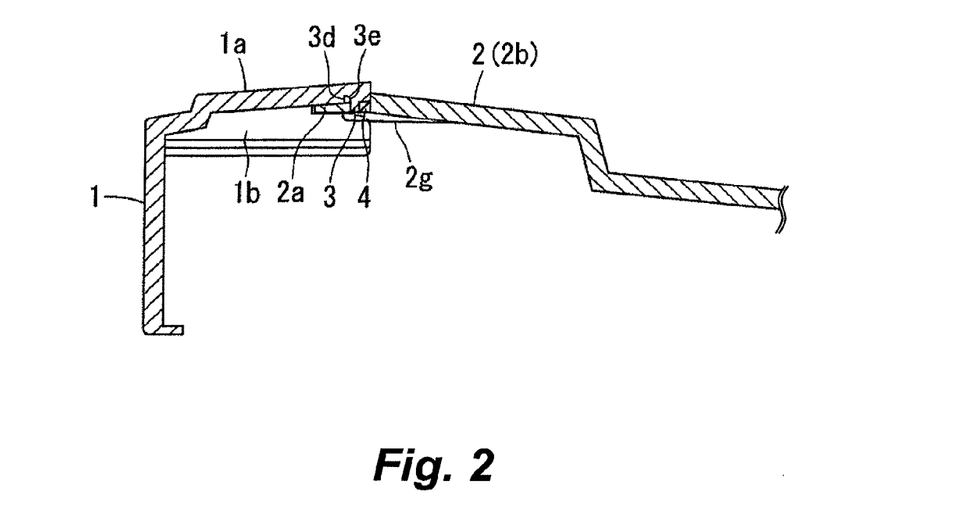
FIG. 2 is a detailed side cross sectional view of the cabinet in a circle A illustrated in FIG. 1.
Figure 3:
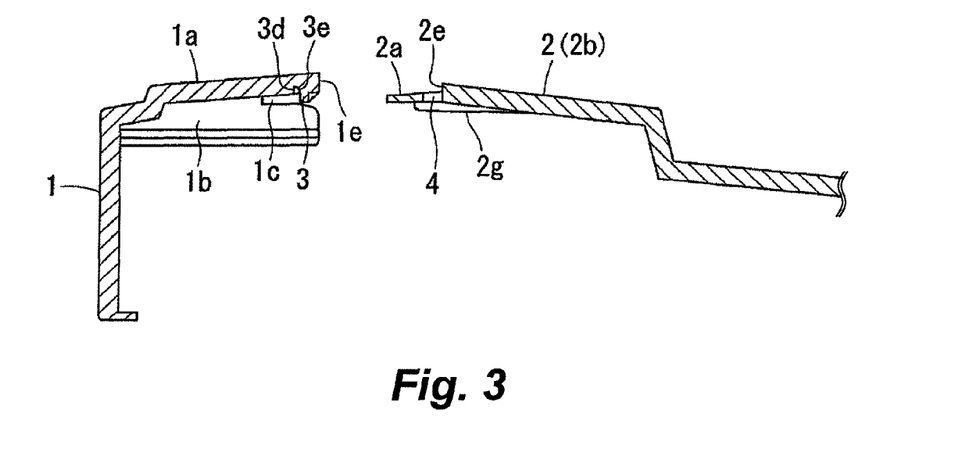
FIG. 3 is a detailed exploded side cross sectional view of the cabinet in the circle A illustrated in FIG. 1.

As shown in FIGS. 2 and 3, the front cabinet 1 has an upper wall (e.g., second wall section) 1a, and a plurality of (three, for example) engagement protrusions 3. The upper wall 1a is located on top of the front cabinet 1. The engagement protrusions 3 are located on an inner face (lower face) of a rear end portion of the upper wall 1a. The engagement protrusions 3 extend inward (downward) with respect to the inner face of the upper wall 1a. The engagement protrusions 3 are formed at spaced apart locations along the upper wall 1a in a lateral direction (right-to-left direction) of the front cabinet 1. The rear cabinet 2 has an upper wall (e.g., first wall section) 2b, and a plurality of (three, for example) engagement holes 4. The upper wall 2b is located on top of the rear cabinet 2. The engagement holes 4 are located on a front end portion 2a of the upper wall 2b. The engagement holes 4 are formed at spaced apart locations corresponding to the engagement protrusions 3 along the upper wall 2b in a lateral direction (right-to-left direction) of the rear cabinet 2. Each of the engagement protrusions 3 is fitted and engaged with respective one of the engagement holes 4 when the front cabinet 1 is coupled to the rear cabinet 2. Specifically, each of the engagement protrusions 3 has an engagement face (front side face) that faces the front side of the front cabinet 1, and the engagement face of each of the protrusions 3 engages with an inner face of respective one of the engagement holes 4.

The front end portion 2a of the rear cabinet 2 is formed in a stepped shape, as shown in FIG. 3. The front end portion 2a is only about half as thick as a portion of the upper wall 2b of the rear cabinet 2 other than the front end portion 2a. The front end portion 2a has a cross sectional shape that tapers slightly towards a distal end of the front end portion 2a. The front cabinet 1 further has a plurality of (two, for example) reinforcing ribs 1b. The reinforcing ribs 1b are formed on the inner face (lower face) of the upper wall 1a of the front cabinet 1. The reinforcing ribs 1b are formed at spaced apart locations between adjacent pairs of the engagement protrusions 3 in the lateral direction of the front cabinet 1. Each of the reinforcing ribs 1b has a notch groove 1c at a distal end portion of each of the reinforcing ribs 1b. The notch grooves 1c are formed between the reinforcing ribs 1b and the upper wall 1a in a vertical direction of the liquid crystal television TV.

Figure 7:
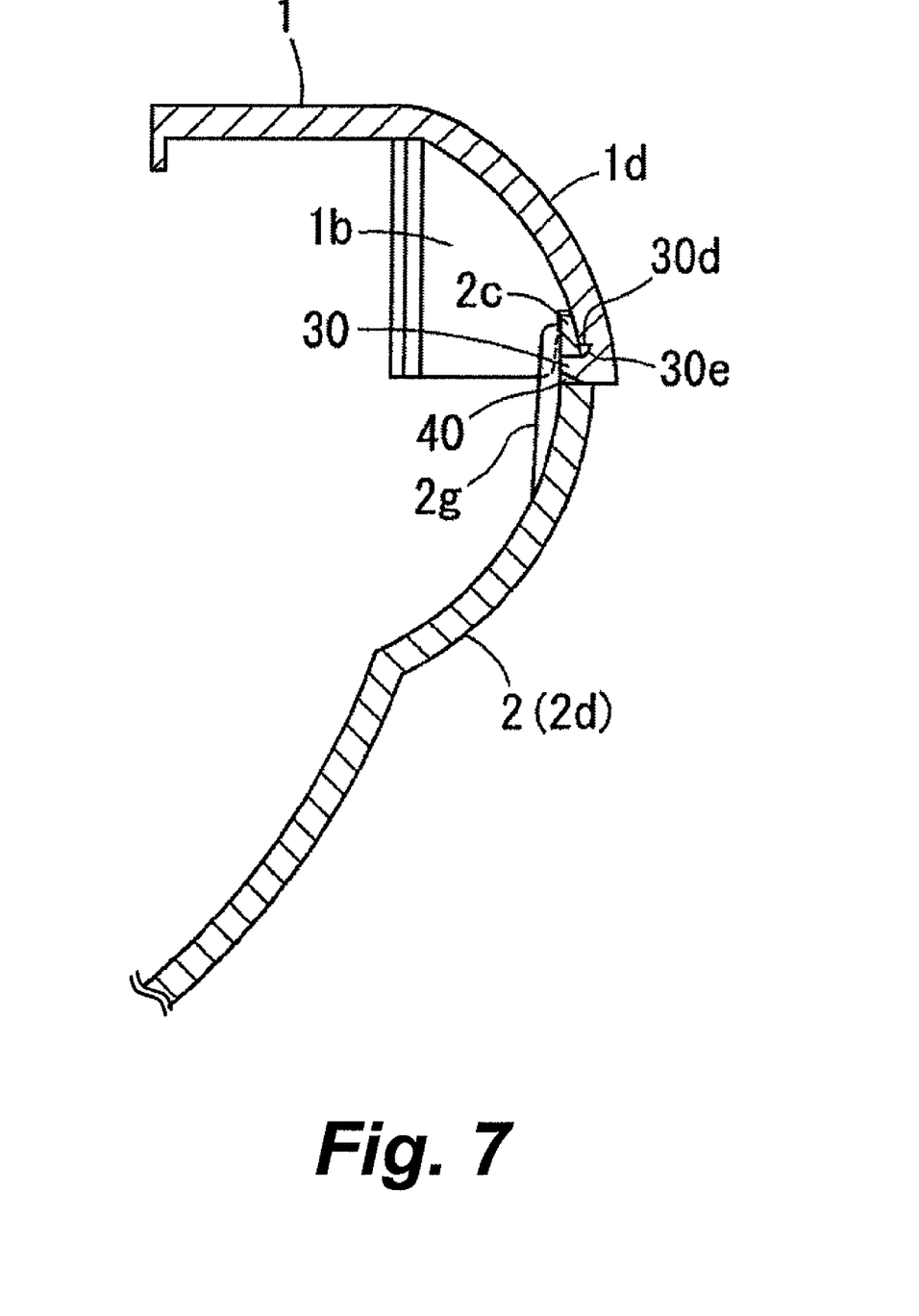
FIG. 7 is a detailed cross sectional view of the cabinet taken along line VII-VII in FIG. 1.
Figure 8:
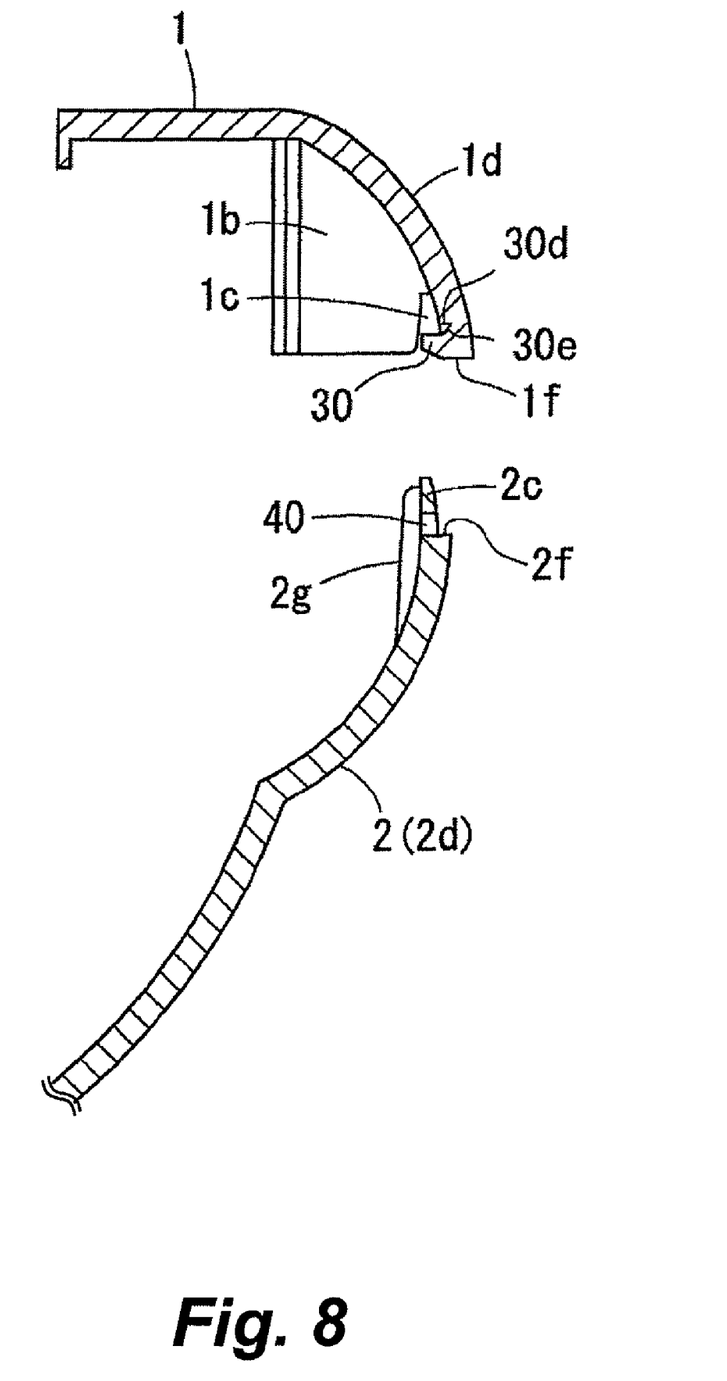
FIG. 8 is a detailed exploded cross sectional view of the cabinet illustrated in FIG. 1.

As shown in FIGS. 7 and 8, the front cabinet 1 further has a pair of side walls 1d, and a plurality of engagement protrusions 30. The side walls 1d are located on left and right sides of the front cabinet 1. The side walls 1d are symmetric to each other. Thus, one of the side walls 1d (hereinafter "side wall 1d") located on the left side of the front cabinet 1 when viewed from the front side of the front cabinet 1 will be explained in detail. The engagement protrusions 30 are located on an inner face of a rear end portion of the side wall 1d. The engagement protrusions 30 extend inward with respect to the inner face of the side wall 1d. The engagement protrusions 30 are formed at spaced apart locations along the side wall 1d in a vertical direction of the front cabinet 1. The engagement protrusions 30 are thicker than the engagement protrusions 3. The rear cabinet 2 further has a pair of side walls 2d, and a plurality of engagement holes 40. The side walls 2d are located on left and right sides of the rear cabinet 2. The side walls 2d are symmetric to each other. Thus, one of the side walls 2d (hereinafter "side wall 2d") located on the left side of the rear cabinet 2 when viewed from the front side of the rear cabinet 2 will be explained in detail. The engagement holes 40 are located on a front end portion 2c of the side wall 2d. The engagement holes 40 are formed at spaced apart locations corresponding to the engagement protrusions 30 along the side wall 2d in a vertical direction of the rear cabinet 2. Each of the engagement protrusions 30 is fitted and engaged with respective one of the engagement holes 40 when the front cabinet 1 is coupled to the rear cabinet 2. Specifically, each of the engagement protrusions 30 has an engagement face that faces the front side of the front cabinet 1, and the engagement face of each of the protrusions 30 engages with an inner face of respective one of the engagement holes 40.

The front end portion 2c of rear cabinet 2 is formed in a stepped shape, as shown in FIG. 8. The front end portion 2c is only about half as thick as a portion of the side wall 2d of the rear cabinet 2 other than the front end portion 2c. The front end portion 2c has a cross sectional shape that tapers slightly towards a distal end of the front end portion 2c. The front cabinet 1 further has a plurality of reinforcing ribs 1b. The reinforcing ribs 1b are formed on the inner face (lower face) of the side wall 1d of the front cabinet 1. The reinforcing ribs 1b are formed at spaced apart locations between adjacent pairs of the engagement protrusions 30 in the vertical direction of the front cabinet 1. Each of the reinforcing ribs 1b has a notch groove 1c at a distal end portion of each of the reinforcing ribs 1b. The notch grooves 1c are formed between the reinforcing ribs 1b and the side wall 1d in the lateral direction of the liquid crystal television TV.

The rear cabinet 2 further has a lower wall. A front end portion of the lower wall of the rear cabinet 2 is also formed in the same stepped shape as the front end portion 2a or 2c of the rear cabinet 2. The front end portion of the lower wall of the rear cabinet 2 is only about half as thick as a portion of the lower wall of the rear cabinet 2 other than the front end portion of the lower wall. The front end portion has a cross sectional shape that tapers slightly towards a distal end of the front end portion. The front cabinet 1 further has a plurality of reinforcing ribs. The reinforcing ribs are formed at spaced apart locations on an inner face of a lower wall of the front cabinet 1. Each of the reinforcing ribs has a notch groove at a distal end portion of each of the reinforcing ribs. The notch grooves are formed between the reinforcing ribs and the lower wall in the vertical direction of the liquid crystal television TV. However, the lower wall of the front cabinet 1 does not have engagement protrusions, and the lower wall of the rear cabinet 2 does not have engagement holes.

The front end portion 2a of the upper wall 2b are inserted into the notch grooves 1c formed between the upper wall 1a of the front cabinet 1 and the reinforcing ribs 1b, thereby engaging the engagement protrusions 3 of the front cabinet 1 into the corresponding engagement holes 4 of the rear cabinet 2. The front end portion 2c of the side wall 2d are inserted into the notch grooves 1c formed between the side wall 1d of the front cabinet 1 and the reinforcing ribs 1b, thereby engaging the engagement protrusions 30 of the front cabinet 1 into the corresponding engagement holes 40 of the rear cabinet 2. Furthermore, the front end portion of the lower wall of the rear cabinet 2 are inserted into the notch grooves formed between the lower wall of the front cabinet 1 and the reinforcing ribs. As a result, a rear end face (e.g., end face portion) 1e of the upper wall 1a, a rear end face 1f of the side wall 1d, and a rear end face of the lower wall of the front cabinet 1 contacts with a stepped face 2e of the front end portion 2a of the rear cabinet 2, a stepped face 2f of the front end portion 2c of the rear cabinet 2, and a stepped face of the front end portion of the lower wall of the rear cabinet 2, respectively. Thus, the front cabinet 1 and the rear cabinet 2 can be joined and fixed without any looseness. Furthermore, four corners of the front cabinet 1 and the rear cabinet 2 are screwed together, providing an even stronger joint.

No engagement protrusion or engagement hole is provided to the rear end portion of the lower wall of the front cabinet 1 or the front end portion of the lower wall of the rear cabinet 2. Therefore, lower portions of the front cabinet 1 and the rear cabinet 2 are screwed together at a plurality of locations to increase the joint strength when the front cabinet 1 is coupled to the rear cabinet 2.

Figure 4:
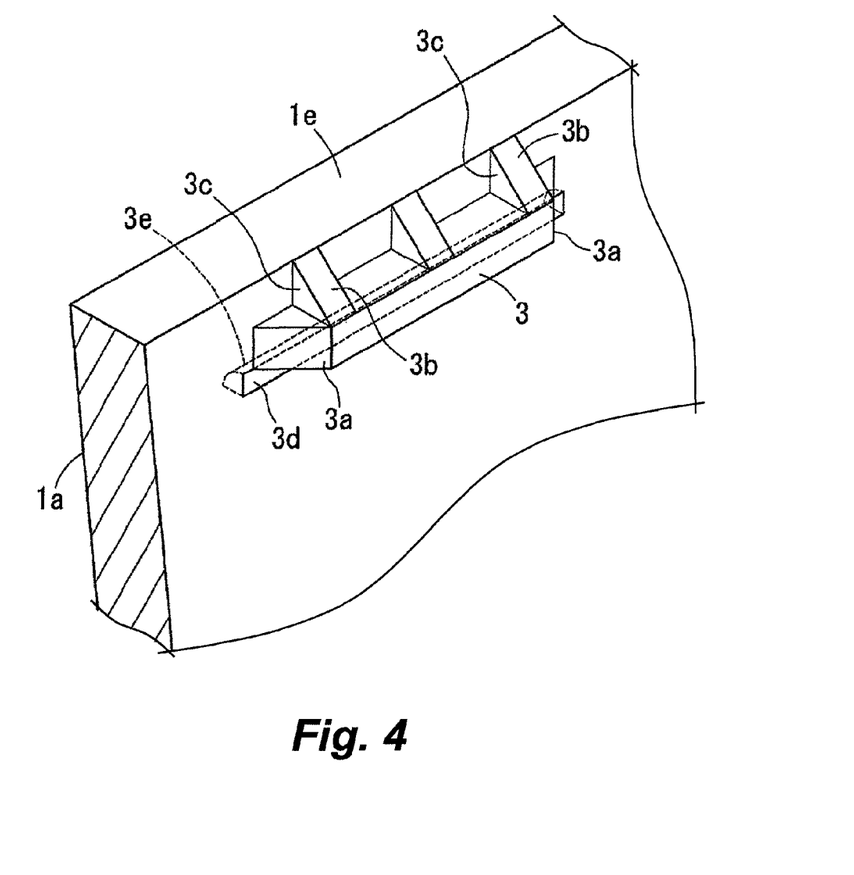
FIG. 4 is a detailed perspective view of a front cabinet of the cabinet illustrated in FIG. 1.

As shown in FIG. 4, each of the engagement protrusions 3 (hereinafter "engagement protrusion 3") of the front cabinet 1 has a slender tab shape longer in the lateral direction (right-to-left direction) of the front cabinet 1. The engagement protrusion 3 includes a pair of left and right side faces. The left and right side faces are formed as inclined side faces 3a that incline at an angle of about 45° with respect to the inner face of the upper wall 1a. The inclined side faces 3 a incline closer to each other toward a distal end face (e.g., distal end portion or lower end face) of the engagement protrusion 3 from a base portion of the engagement protrusion 3. Therefore, the engagement protrusion 3 has an isosceles trapezoidal shape when viewed from the front side (or the rear side) of the front cabinet 1. With this arrangement, when the front cabinet 1 and rear cabinet 2 are taken apart, even if the rear cabinet 2 should be pulled away from the front cabinet 1 at an angle, an edge portion of the corresponding engagement hole 4 that has been engaged with the engagement protrusion 3 will not snag on the inclined side faces 3a (left and right side faces) of the engagement protrusion 3. Thus, there is no worry that the engagement protrusion 3 will break.

The front cabinet 1 further includes a plurality of guide components 3c (three, for example) that is formed at spaced apart locations on the inner faces of the upper wall 1a along a rear side face (e.g., opposite face or upper face in FIG. 4) of the engagement protrusion 3. Each of the guide components 3c has a inclined guide face 3b that extends from the rear end face (e.g., end face portion) 1e of the upper wall 1a to the distal end face of the engagement protrusion 3. The rear side face of the engagement protrusion 3 is located opposite to the engagement face of the engagement protrusion 3. Accordingly, when the front cabinet 1 and rear cabinet 2 are joined, the front end portion 2a of the upper wall 2b of the rear cabinet 2 is smoothly inserted on an inner side (lower side) of the rear end portion of the upper wall 1a of the front cabinet 1 by the guide components 3c. Therefore, the engagement protrusion 3 and the corresponding engagement hole 4 can be easily engaged. Also, the engagement protrusion 3 is reinforced by the guide components 3c. Thus, the engagement protrusion 3 is even less apt to break.

If the guide components 3c are formed over the entire rear side face of the engagement protrusion 3, there is the risk that so-called "sink marks" will appear on an outer face of the rear end portion of the upper wall 1a during cooling after molding. However, since the guide components 3c are formed at spaced apart locations as mentioned above, the sink marks can be prevented.

Figure 6:
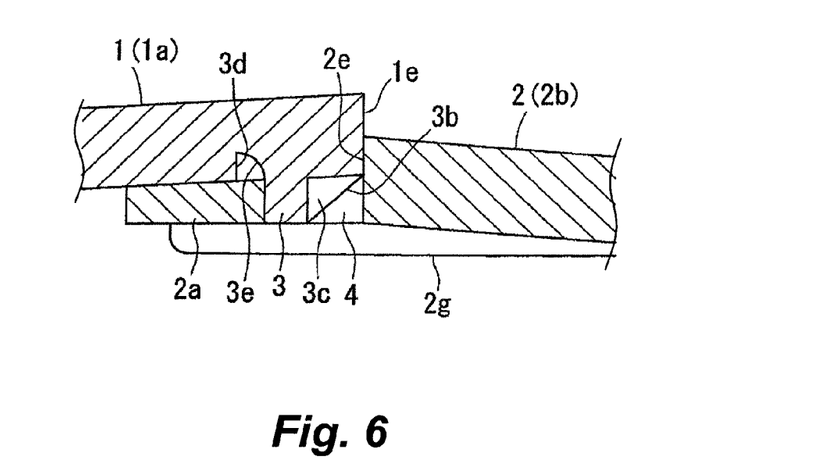
FIG. 6 is a detailed side cross sectional view of the front cabinet and the rear cabinet.

As shown in FIGS. 4 and 6, the front cabinet 1 further has a plurality of groove-shaped recesses 3d that is formed at locations corresponding to the engagement protrusions 3. Each of the recesses 3d (hereinafter "recess 3d") is formed in the inner face of the rear end portion of the upper wall 1a along the base portion of respective one of the engagement protrusions 3. Specifically, the recess 3d is formed on the front side (front side face side or lower face side in FIGS. 4 and 6) of the front cabinet 1 with respect to the engagement protrusion 3. The recess 3d has a lengthwise dimension in the lateral direction of the front cabinet 1 larger than that of the engagement protrusion 3. The recess 3d has a rounded portion 3e extending from the base portion of the engagement protrusion 3 on the front side to a bottom end portion of the recess 3d. The rounded portion 3e is formed in the interior of the recess 3d. Specifically, a curved face of the rounded portion 3e is located above the inner face of the upper wall 1a. The rounded portion 3e increases the resistance strength of the engagement protrusion 3. To sufficiently increase the resistance strength of the engagement protrusion 3, it is preferable if the depth of the recess 3d and the radius of the rounded portion 3e are set to be about ⅓ to ½ the thickness of a portion of the upper wall 1a of the front cabinet 1 other than the rear end portion of the upper wall 1a. More specifically, when the thickness of the portion of the upper wall 1a other than the rear end portion is about 2 mm, the depth of the recess 3d and the radius of the rounded portion 3e are preferably set to about 0.6 to 1 mm.

When a rounded portion is formed at the corner of the engagement face of the engagement protrusion 3 and the inner face of the upper wall 1a below the inner face, the rounded portion interferes with the edge portion of the engagement hole 4 when the engagement protrusion 3 is engaged with the engagement hole 4. However, since the rounded portion 3e is formed in the interior of the recess 3d, the rounded portion 3e will not interfere with the edge portion of the engagement hole 4 when the engagement protrusion 3 is engaged with the corresponding engagement hole 4. Therefore, the engagement protrusion 3 can be securely engaged with the engagement hole 4 all the way to the base portion (bottom) of the engagement protrusion 3. Furthermore, since the resistance strength of the engagement protrusion 3 is increased by the rounded portion 3e, this sufficiently prevents breakage of the engagement protrusion 3 when the front cabinet 1 and the rear cabinet 2 are taken apart.

Figure 5:
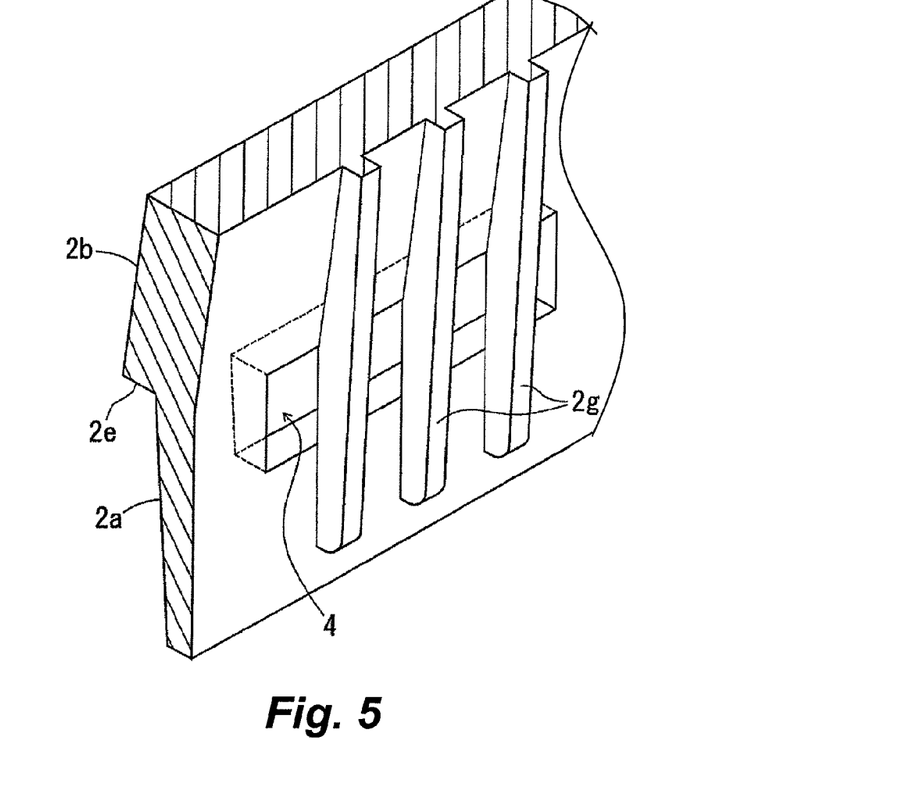
FIG. 5 is a detailed perspective view of a rear cabinet of the cabinet illustrated in FIG. 1.

As shown in FIGS. 5 and 6, each of the engagement holes 4 (hereinafter "engagement hole 4") formed in the front end portion 2a of the rear cabinet 2 has a rectangular opening. The engagement hole 4 is large enough for the corresponding engagement protrusion 3 and the guide components 3c to fit in. The rear cabinet 2 further has a plurality of ribs 2g (three, for example) formed for reinforcement on an inner side (lower side) of the engagement hole 4. The ribs 2g extend across the engagement hole 4. The ribs 2g prevent the engagement hole 4 from breaking when the front cabinet 1 and the rear cabinet 2 are taken apart.

Each of the engagement protrusions 30 (hereinafter "engagement protrusion 30") formed on the side wall 1d of the front cabinet 1 is in the form of a tab that is thicker than the engagement protrusion 3 formed on the upper wall 1a. Furthermore, the engagement protrusion 30 has an inclined guide face that is formed on an opposite side face from the engagement face that is engaged with the corresponding engagement hole 40. As shown in FIGS. 7 and 8, a groove-shaped recess 30d is formed along the base portion of the engagement protrusion 30 on the engagement face side of the engagement protrusion 30. The recess 30d has a lengthwise dimension in the vertical direction of the front cabinet 1 larger than that of the engagement protrusion 30. The recess 30d has a rounded portion 30e extending from the base portion of the engagement protrusion 30 on the engagement face side to a bottom end portion of the recess 30d. The rounded portion 30e is formed in the interior of the recess 30d, and increases the resistance strength of the engagement protrusion 30. The rounded portion 30e will not interfere with the edge portion of the corresponding engagement hole 40 when the engagement protrusion 30 is engaged with the engagement hole 40. Thus, the engagement protrusion 30 can be securely engaged with the engagement hole 40 all the way to the base portion (bottom) of the engagement protrusion 30, and the rounded portion 30e sufficiently prevents breakage of the engagement protrusion 30.

As shown in FIGS. 7 and 8, the rear cabinet 2 further has a plurality of ribs 2g formed for reinforcement on an inner side of each of the engagement holes 40. The ribs 2g prevent breakage of the engagement hole 40.

With the cabinet 10 for the liquid crystal television TV, the engagement protrusions 3 and 30 are formed on the rear end portion of the upper wall 1a and the rear end portion of the side wall 1d, respectively. Furthermore, the engagement holes 4 and 40 are formed in the front end portion 2a of the upper wall 2b and the front end portion 2c of the side wall 2d. However, this arrangement can be reversed, so that the engagement holes 4 and 40 are formed in the rear end portion of the upper wall (e.g., first wall section) 1a and the rear end portion of the side wall 1d, respectively, and the engagement protrusions 3 and 30 are formed on the front end portion 2a of the upper wall (e.g., second wall section) 2b and the front end portion 2c of the side wall 2d.

Also, the engagement protrusions and the engagement holes can be formed at the rear end portion of the lower wall of the front cabinet 1 and the front end portion of the lower wall of the rear cabinet 2, respectively. However, in this case the job of separating the front cabinet 1 and the rear cabinet 2 will be harder. Thus, it is preferable for the engagement protrusions and engagement holes not to be formed at the rear end portion of the lower wall of the front cabinet 1 and the front end portion of the lower wall of the rear cabinet 2, respectively, and for the front cabinet 1 and the rear cabinet 2 to fasten with screws instead.

GENERAL INTERPRETATIONS OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of an electronic device equipped with the present invention. Accordingly, these terms, as utilized to describe the present invention should be interpreted relative to an electronic device equipped with the present invention as used in the normal operating position.

While a preferred embodiment has been chosen to illustrate the present invention, it will be apparent to those skilled in the art from these disclosures that various changes and modifications can be made herein without departing from the scope of the invention as defined in the appended claims. Furthermore, the foregoing descriptions of the preferred embodiment according to the present invention are provided for illustration only, and not for the purpose of limiting the invention as defined by the appended claims and their equivalents.

What is claimed is:

1. A cabinet for an electronic device, comprising:
   a first cabinet member having a first wall section with an engagement hole; and
   a second cabinet member fixedly coupled to the first cabinet member, the second cabinet member having a second wall section, an engagement protrusion that is formed on the second wall section with the engagement protrusion having an engagement face that is engaged with an inner face of the engagement hole of the first wall section, and a recess that is formed on the second wall section along a base portion of the engagement protrusion with the recess having a rounded portion extending from the engagement face of the engagement protrusion between the base portion of the engagement protrusion and a bottom portion of the recess within the recess, the recess continuously extending along an entire length of the engagement protrusion, the second cabinet member further has a guide component on the second wall section along an opposite face of the engagement face of the engagement protrusion, the guide component has an inclined guide face that extends between an end face portion of the second wall section and a distal end portion of the engagement protrusion.

2. The cabinet according to claim 1, wherein the engagement protrusion of the second cabinet member further includes a pair of inclined side faces that inclines closer to each other toward a distal end portion of the engagement protrusion.

3. The cabinet according to claim 1, wherein the engagement protrusion and the guide components of the second cabinet member are disposed within the engagement hole of the first wall section when the second cabinet member is coupled to the first cabinet member.

4. The cabinet according to claim 1, wherein the engagement protrusion and the guide component of the second cabinet member are disposed within the engagement hole of the first wall section when the second cabinet member is coupled to the first cabinet member.

5. The cabinet according to claim 1, wherein the electronic device includes a liquid crystal television.

6. The cabinet according to claim 1, wherein the first and second cabinet members are made of synthetic resin, respectively.

7. The cabinet according to claim 6, wherein the first cabinet member is integrally formed as a one-piece, unitary member, and the second cabinet member is integrally formed as a one-piece, unitary member.

8. The cabinet according to claim 1, wherein the first cabinet member further has a plurality of ribs, the ribs being formed on the first wall section and extending across the engagement hole of the first wall section.

9. The cabinet according to claim 1, wherein the recess of the second cabinet member has a lengthwise dimension larger than that of the engagement protrusion of the second cabinet member.

* * * * *